(12) United States Patent
Takagi et al.

(10) Patent No.: US 7,781,956 B2
(45) Date of Patent: Aug. 24, 2010

(54) DISPLAY APPARATUS AND ELECTRONIC DEVICE

(75) Inventors: Akitsuna Takagi, Aichi (JP); Jiro Yamada, Kanagawa (JP); Tomotaka Nishikawa, Aichi (JP)

(73) Assignee: Sony Corporation, Tokyo (JP)

( * ) Notice: Subject to any disclaimer, the term of this patent is extended or adjusted under 35 U.S.C. 154(b) by 135 days.

(21) Appl. No.: 12/047,473

(22) Filed: Mar. 13, 2008

(65) Prior Publication Data

US 2008/0224594 A1    Sep. 18, 2008

(30) Foreign Application Priority Data

Mar. 15, 2007 (JP) ............................ 2007-0066107

(51) Int. Cl.
*H01J 1/62* (2006.01)
*H01J 63/04* (2006.01)

(52) U.S. Cl. ................ 313/498; 313/502; 313/504; 313/506; 313/512

(58) Field of Classification Search .......... 313/498–512
See application file for complete search history.

(56) References Cited

U.S. PATENT DOCUMENTS 6,008,582 A * 12/1999 Asano et al. ................ 313/582

| | | | |
|---|---|---|---|
| 2004/0021413 A1* | 2/2004 | Ito et al. | 313/504 |
| 2004/0232829 A1* | 11/2004 | Ohshita et al. | 313/504 |
| 2005/0001546 A1* | 1/2005 | Yamaguchi | 313/512 |
| 2005/0116632 A1* | 6/2005 | Funamoto et al. | 313/506 |
| 2006/0125385 A1* | 6/2006 | Lu et al. | 313/506 |
| 2007/0075618 A1* | 4/2007 | Mitsuya | 313/292 |
| 2007/0194699 A1* | 8/2007 | Lee et al. | 313/505 |
| 2008/0036374 A1* | 2/2008 | Okano | 313/506 |
| 2008/0129197 A1* | 6/2008 | Ozawa et al. | 313/505 |
| 2008/0218369 A1* | 9/2008 | Krans et al. | 340/691.1 |

FOREIGN PATENT DOCUMENTS

| JP | 2001196171 | 7/2001 |
|---|---|---|
| JP | 2005101009 | 4/2005 |

* cited by examiner

*Primary Examiner*—Toan Ton
*Assistant Examiner*—Kevin Quarterman
(74) *Attorney, Agent, or Firm*—K&L Gates LLP

(57) ABSTRACT

A display apparatus includes: a substrate; and a plurality of light emitting elements arrayed on the substrate and each formed from a lower electrode, a light emitting function layer and an upper electrode stacked in this order on the substrate. A rib for element isolation is provided on the substrate and has a plurality of openings individually corresponding to the light emitting elements. Each of the openings of the rib being formed such that at least one of sides which define a shape in plan is formed only from a curved line or extends in a non-parallel relationship to that of another one of the openings.

9 Claims, 9 Drawing Sheets

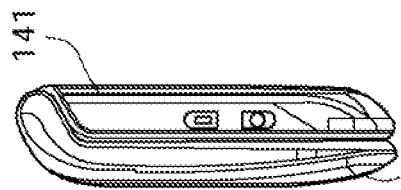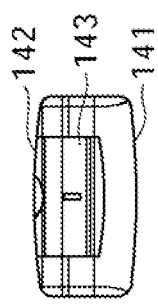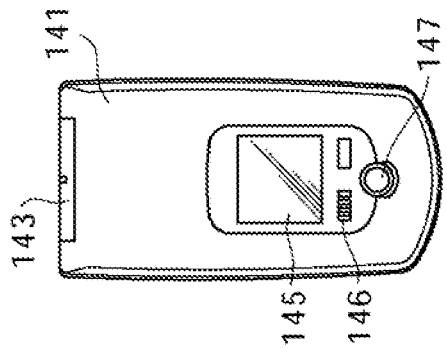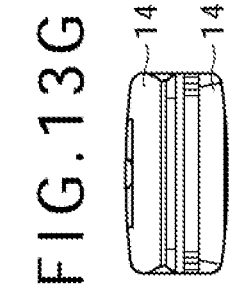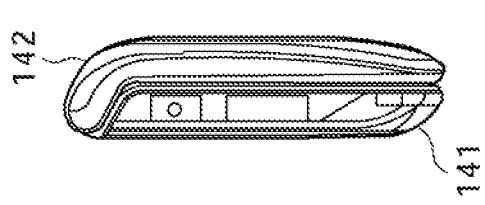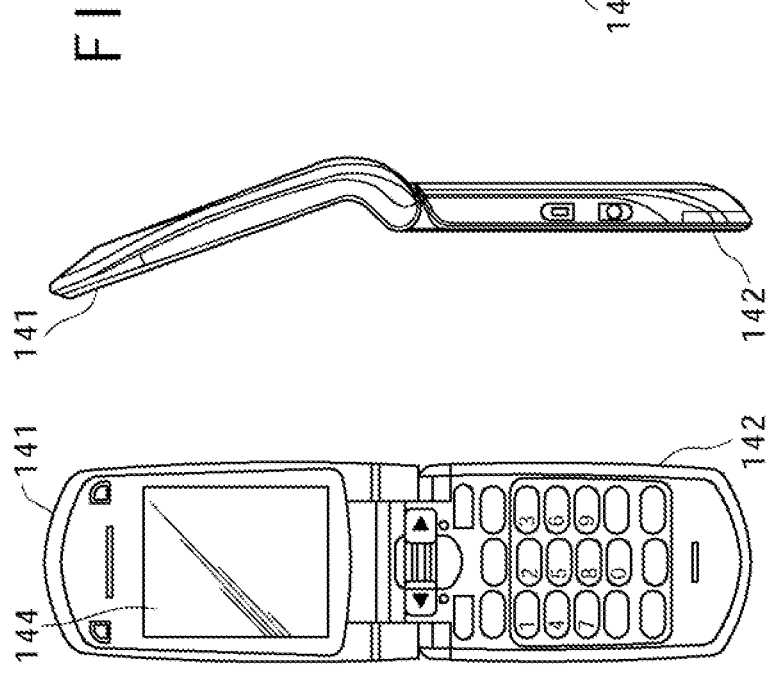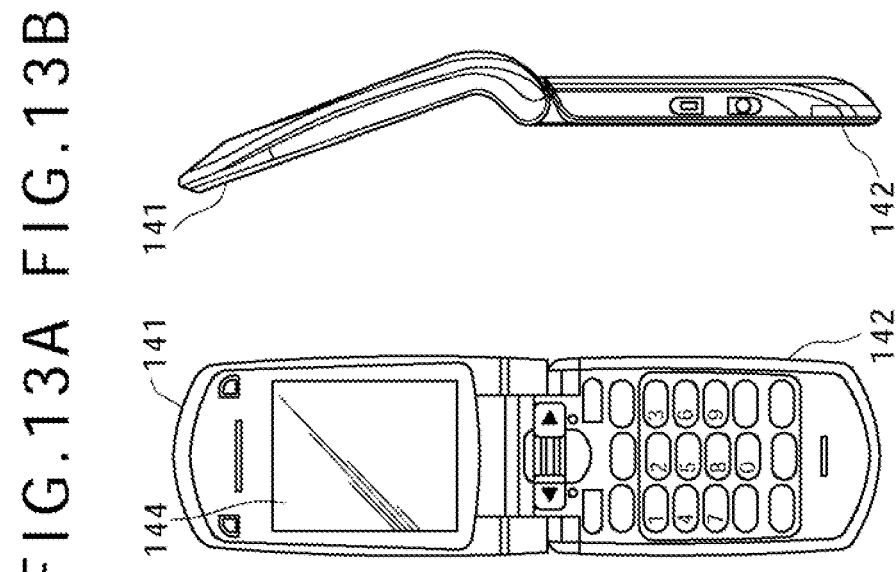

DISPLAY APPARATUS AND ELECTRONIC DEVICE

CROSS REFERENCES TO RELATED APPLICATIONS

The present application claims priority to Japanese Patent Application. JP 2007-0066107 filed with the Japan Patent Office on Mar. 15, 2007, the entire contents of which is being incorporated herein by reference.

BACKGROUND

The present application relates to a display apparatus and an electronic device, aid more particularly to a display apparatus wherein a plurality of light emitting elements such as organic electroluminescence elements are arrayed on a substrate and an electronic device which incorporates the display apparatus.

An organic electroluminescence light emitting element (organic EL element) which makes use of electroluminescence (EL) of an organic material attracts attention as a light emitting element which is superior in high speed responsibility and can emit light of high luminance by low voltage dc driving. The organic EL element includes an organic layer including a light emitting layer sandwiched between two electrodes such that emitted light is extracted through one of the electrodes. A display apparatus called organic EL display apparatus in which such an organic EL element as just described is used includes a plurality of organic EL elements arrayed on a substrate. Meanwhile, in an organic EL display apparatus of the active matrix driving type, a driving element is provided for each of pixels on a substrate, and organic EL elements are formed and arrayed on a flattening insulating film which covers such driving elements.

As one of configurations for allowing such an organic EL display apparatus as described above to achieve color display, a configuration is available wherein a light emitting material is formed in a pattern on a light emitting layer of each pixel. Also various other configurations are available including a configuration wherein a color filter and a color conversion layer are combined with a white light emitting element and another configuration wherein a common light emitting layer which emits white light is used and only a predetermined wavelength is taken out by multiple interference.

It is examined to apply such an organic EL display apparatus as described above not only to a large-sized display apparatus such as a monitor but also to such a small-sized display apparatus as represented by a viewer. In this instance, in order to differentiate the organic EL display apparatus from existing liquid crystal display apparatus from a point of view of the display performance, it is necessary to raise the performance of the organic EL display apparatus as high as possible.

Incidentally, a plurality of organic EL elements formed and arrayed on a flattening insulating film as described above are isolated from each other in the following manner by a rib. In particular, lower electrodes are provided in rows and columns and individually formed in a pattern in pixels such that they are individually connected to driving elements, and a rib is provided in a state wherein it covers peripheral edges of the lower electrodes. An organic layer including a light emitting element is formed and stacked on the lower electrodes which are exposed through openings of the rib, and an upper electrode is formed and stacked on the organic layer. It is significant that, in the state described above, the lower electrodes and the upper electrode are isolated from each other by the rib and the organic layers.

It has been proposed to form the rib in such a configuration that a corner of each opening is formed in an arcuate or polygonal shape in accordance with an arcuate shape of a corner portion of an organic layer, that is, an organic EL light emitting thin film, formed as a mask by vapor deposition through a metal mask. According to the configuration, short-circuiting between the lower electrode and the upper electrodes caused by displacement in pattern of the organic layer can be prevented. See, for example, Japanese Patent Laid-Open No. 2001-196171. Also another configuration is known and disclosed in Japanese Patent Laid-Open No. 2005-101009 wherein an edge portion at an end portion of an opening has some curvature and aside wall of the opening has an inclination angle.

SUMMARY

Since it is considered that a display apparatus or organic EL display apparatus having any of the configurations described above does not achieve sufficient visual observability at a light place or sufficient color impurity as yet, there is a sufficient room for improvement. One of points for improvement is a problem of reflection of light by side walls of a rib. In particular, it is confirmed that, where the display apparatus is observed from the front, external light incoming at any angle other than the angle from the front with respect to the substrate is reflected by the side walls of the rib and emitted to the front of the substrate thereby to deteriorate the visual observability.

Therefore, it is desirable to provide a display apparatus wherein deterioration of the visual observability by reflection of light by side walls of a rib which covers peripheral edges of lower electrodes formed in a pattern for individual pixels can be prevented thereby to achieve a good display characteristic and an electronic device which includes such a display apparatus as just described.

According to an embodiment, there is provided a display apparatus including a substrate, and a plurality of light emitting elements arrayed on the substrate and each formed from a lower electrode, a light emitting function layer and an upper electrode stacked in this order on the substrate. A rib for element isolation is provided on the substrate and has a plurality of openings individually corresponding to the light emitting elements. Each of the openings of the rib being formed such that at least one of sides which define a shape in plan is formed only from a curved line or extends in a non-parallel relationship to that of another one of the openings.

According to another embodiment, there is provided an electronic device including a display apparatus. The display apparatus includes a substrate, a plurality of light emitting elements arrayed on the substrate and each formed from a lower electrode, a light emitting function layer and an upper layer stacked in this order on the substrate, and a display section. A rib for element isolation is provided on the substrate and has a plurality of openings individually corresponding to the light emitting elements. Each of the openings of the rib being formed such that at least one of sides which define a shape in plan is formed only from a curved line or extends in a non-parallel relationship to that of another one of the openings.

In the display apparatus and the electronic device, external light incoming to the side walls of the openings of the rib is prevented from being reflected toward the same direction by the side walls of the openings. In particular, where at least one of sides which define a shape in plan is formed only from a curved line, external light is diffused and reflected by the side wall corresponding to the side of the curved line. On the other hand, where at least one of sides which define a shape in plan extends in a non-parallel relationship to that of another one of the openings, external light is reflected by the non-parallel side walls toward different directions in which the side walls are directed.

In this manner, with the display apparatus and the electronic device, since external light incoming to the side walls of the plural openings provided in the rib can be prevented from being reflected in the same direction, deterioration of the visual observability of display light by reflection of external light can be prevented. Consequently, enhancement of the display characteristic of the display apparatus can be anticipated.

Additional features and advantages are described herein, and will be apparent from the following Detailed Description and the figures.

BRIEF DESCRIPTION OF THE FIGURES

FIGS. 13A, 13B, 13C, 13D, 13E, 13F and 13G show a portable terminal apparatus such as a portable telephone set to which the present embodiment is applied and are a front elevational view and a side elevational view of the portable telephone set in an open state and a front elevational view, a left side elevational view; a right side elevational view, a top plan view and a bottom plan view of the portable telephone set in a closed state, respectively.

DETAILED DESCRIPTION

An embodiment of the present application will be described in detail below with reference to the drawings.

Figure 1:
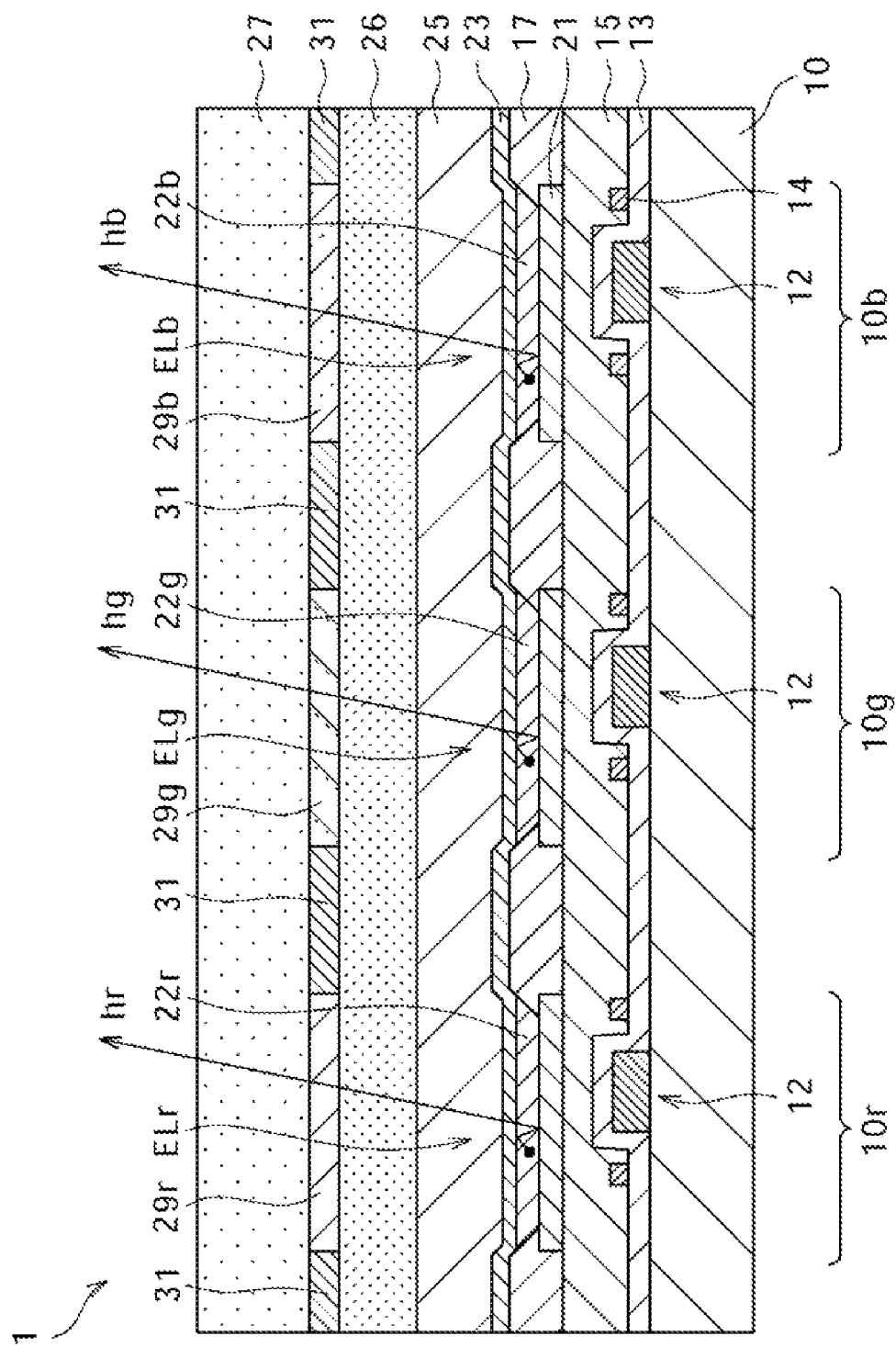
FIG. 1 is a partial schematic sectional view showing a configuration of a display apparatus to which the present embodiment is applied.

FIG. 1 shows a configuration of a display apparatus to which the present embodiment is applied. Referring to FIG. 1, the display apparatus 1 shown is formed as an organic EL display apparatus wherein organic electroluminescence light emitting elements ELr, ELg and ELb are disposed on pixels 10r, 10g and 10b on a substrate 10, respectively. A red light emitting element ELr which emits red light hr is disposed in each of the red pixels 10r; a green light emitting element ELg which emits green light hg is disposed in each of the green pixels 10g; and a blue light emitting element ELb which emits blue light hb is disposed in each of the blue pixels 10b. The color Sight beams hr, hg and hb radiated from the organic electroluminescence Sight emitting elements ELr, ELg and ELb, respectively, are taken out from the opposite side to the substrate 10. Thus, the display apparatus 1 is configured so as to have a top emission type structure. First, a general configuration of the display apparatus 1 is described in order from the lower layer side.

Thin film transistors (TFTs) 12, an insulating layer 13, driving wiring lines 14 and a flattening insulating layer 15 are provided on the substrate 10. The organic electroluminescence elements ELr, ELg and ELb which emit light beams of the individual colors are provided on the flattening insulating layer 15.

Each of the organic electroluminescence light emitting elements ELr, ELg and ELb is formed from a lower electrode 21 formed, for example, from a reflecting electrode, a light emitting function layer 22r, 22g or 22b formed by principally stacking an organic material and a common upper electrode 23 made of a translucent material. The organic electroluminescence light emitting elements ELr, ELg and ELb are isolated from each other by a rib 17 called window insulating film which covers peripheral edges of the lower electrodes 21. In the present, embodiment, the display apparatus 1 is characterized in the shape of the rib 17 which isolates the organic electroluminescence light emitting elements ELr, ELg and ELb from one another. The characteristic feature is described at the last, part of the present, specification.

An enclosure substrate 27 is adhered to the organic electroluminescence light emitting elements ELr, ELg and ELb with a protective layer 25 and an adhesion layer 26 interposed therebetween. Thus, the display apparatus 1 is configured such that a plurality of organic electroluminescence light emitting elements ELr, ELg and ELb are sandwiched between the substrate 10 and the enclosure substrate 27.

Now, a detailed configuration of the individual members described above is described.

The substrate 10 supports the other components of the display apparatus 1 such as the TFTs 12 and the organic electroluminescence light emitting elements ELr, ELg and ELb and is made of an insulating material such as, for example, a silicon (Si) material or a plastic material.

The TFTs 12 are provided to drive the organic electroluminescence light emitting elements ELr, ELg and ELb and are disposed, for example, in a matrix corresponding to the pixels 10r, 10g and 10b of the substrate 10. It is to be noted that the structure itself of the TFTs 12 is not limited particularly but may be a bottom gate type structure or a top gate type structure.

The insulating layer 13 electrically isolates the TFTs 12 from surroundings and is made of an insulating material such as, for example, silicon dioxide ($SiO_2$) or PSG (Phospho-Silicate Glass). The insulating layer 13 is disposed in such a manner as to cover, for example, the TFTs 12 and the substrate 10 around the TFTs 12.

The driving wiring lines 14 function as signal lines to drive the organic electroluminescence elements EL (ELr, ELg and ELb) and are made of a conductive material such as, for example, aluminum (Al) or aluminum-copper alloy (AlCu). The driving wiring lines 14 are provided as signal lines, power supply lines or some other wiring lines for the TFTs 12 and are electrically connected to the TFTs 12 through contact holes (not shown) provided in the insulating layer 13.

The flattening insulating layer 15 electrically isolates the TFTs 12 and driving wiring lines 14 and the organic electroluminescence light emitting elements ELr, ELg and ELb from each other and flattens the foundation on which the organic electroluminescence light emitting elements ELr, ELg and ELb are disposed. The flattening insulating layer 15 is made of an insulating material such as, for example, silicon dioxide (SiO2). If is to be noted that, though not shown in FIG. 1, for example, capacitors for driving the TFTs 12, multi-layer wiring lines for electrically connecting the driving wiring lines 14 and the organic electroluminescence elements EL and so forth are embedded in the flattening insulating layer 15.

Each of the organic electroluminescence light emitting elements ELr, ELg and ELb has the following configuration.

Each of the organic electroluminescence light emitting elements ELr, ELg and ELb is an element of the self luminous type which makes use of an organic EL phenomenon to emit light for image display. As described above, red light emitting elements ELr which emit red light hr having a wavelength typically of approximately 620 nm, green light emitting elements ELg which emit green light hg having a wavelength typically of 530 nm and blue light emitting elements ELb which emit blue light hb having a wavelength typically of 460 nm are disposed. A plurality of sets of such organic electroluminescence light emitting elements ELr, ELg and ELb each including one red light emitting element ELr, one green light emitting element ELg and one blue light emitting element ELb are disposed in a matrix corresponding to an array pattern of the TFTs 12.

Figure 2:
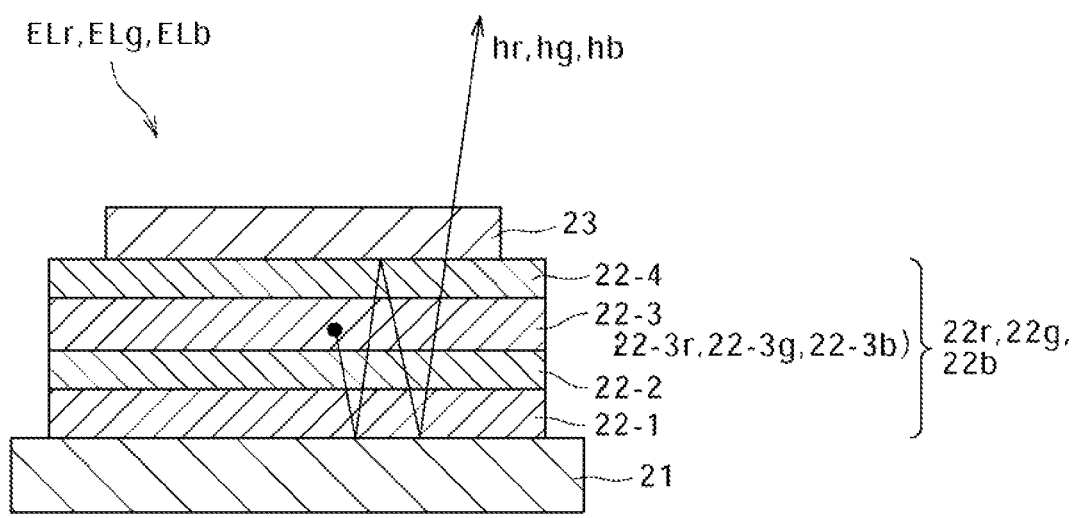
FIG. 2 is a schematic sectional view showing a configuration of an organic electroluminescence light emitting element provided in the display apparatus.

Referring also to FIG. 2, the layers which form the organic electroluminescence light emitting elements ELr, ELg and ELb have such a configuration as described below.

In particular, the lower electrodes 21 are formed in a pattern individually for the pixels 10r, 10g and 10b. Each of the lower electrodes 21 is electrically connected to a driving wiring line 14 through a contact hole not shown formed in the flattening insulating layer 15.

Each of the lower electrodes 21 is provided as an anode and made of an electrode material having a Sight reflecting property. As the electrode material, for example, aluminum (Al), alloy containing aluminum, silver (Ag) or alloy containing silver is used. The "alloy containing aluminum" is alloy which contains aluminum as a main component and may be, for example, aluminum-neodymium alloy (AlNd: for example. Al:Nd=90% by weight: 10% by weight). Meanwhile, the "alloy containing silver" is alloy which contains silver as a main component and may be, for example, silver-palladium-copper alloy (AgPdCu; for example, Ag:Pd:Cu=99% by weight: 0.75% by weight: 0.25% by weight).

The light emitting function layers 22r, 22g and 22b include a light emitting layer which substantially utilizes an organic EL phenomenon to emit light of a particular color. Such light emitting function layers 22r, 22g and 22b have a stack structure wherein, for example, a hole injecting layer 22-1, a hole transport layer 22-2 and a light emitting layer 22-3 (22-3r, 22-3g or 22-3b) which emits light of a corresponding color and an electron transport layer 22-4 are stacked in order from the lower electrode 21 side serving as an anode. Here, the light emitting layers 22-3 are formed in a pattern for individual pixels while each of the other layers is continuously formed commonly to the pixels 10r, 10g and 10b with a uniform thickness.

The hole injecting layer 22-1 is provided to inject holes into the hole transport layer 22-2 and made of, for example, 4,4', 4"-tris(3-methyl-phenyl-phenylamino) triphenylamine(MT-DATA).

The hole transport layer 22-2 transports holes injected from the hole injecting layer 22-1 to the light emitting layer 22-3 and is made of, for example, bis[(N-naphtyl)-N-pheny] benzidine (α-NPD).

Further, the red light emitting layer 22-3r from among the light emitting layers 22-3 makes use of an organic EL phenomenon to emit light of red and is made of, for example, 8-quinolinol-aluminum complex (Alq) in which 4-dicyanomethylene-6-(P-dimethylaminosytil)-2-methyl-4H-pyran (DCM) is mixed by approximately 2% by volume. The green light emitting layer 22-3g makes use of an organic EL phenomenon to generate green light and is made of, for example, 8-quinolinol-aluminum complex (Alq). The blue light emitting layer 22-3b makes use of an organic EL phenomenon to generate blue light and is made of, for example, bathocuproine (BCP).

The electron transport layer 22-4 transports electrons to the light emitting layer 22-3 and is made of for example, 8-quinolinol-aluminum complex (Alq).

The upper electrode 23 on the light emitting function layers 22r, 22g and 22b is provided as a continuous layer common to all pixels 10r, 10g and 10b. The upper electrode 23 is provided as a cathode and functions as a half mirror which reflects light generated by the light emitting function layers 22 (22r, 22g and 22b) so as to resonate and then introduces the light to the outside. The upper electrode 23 is made of a conductive material having a light translucent property and has a single-layer structure made of for example, silver (Ag) or alloy containing silver. The "alloy containing silver" is alloy which contains silver and may be, for example, silver magnesium alloy (AgMg; for example, Ag:Mg=10% by weight: 90% by weight).

Particularly, the reflection factor of the upper electrode 23 serving as the extraction side of generated light is within a range, for example, from approximately 10% to 95%. It is to be noted that the upper electrode 23 need not have a single layer structure but may have a stack structure formed from different materials from each other. More particularly, the upper electrode 23 serving as a cathode may have a two-layer structure wherein a layer, that is, a lower layer, made of, for example, alloy containing magnesium (Mg) and silver (Ag) and another layer, that is, an upper layer, made of silver or alloy containing silver are stacked in this order. The "alloy containing magnesium and silver" is alloy which contains magnesium and silver and may be, for example, magnesium silver alloy (MgAg:Mg:Ag=for example, 5% by weight:1 to 20% by weight:1% by weight). Meanwhile, the "alloy containing silver" is alloy which contains silver and may be, for example, silver magnesium alloy (AgMg; for example, Ag:Mg=10% by weight:90% by weight).

Further, each of the organic electroluminescence light emitting elements ELr, ELg and ELb has a resonator structure which reflects light emitted from the light emitting layer 22-3 between a lower electrode 21 and the upper electrode 23 and functions as a kind of narrow-band filter. The optical distance L between the lower electrode 21 and the upper electrode 23 is a factor which corresponds to the resonance characteristic of the resonator structure described above and satisfies the relationship of the following expression (1):

$$(2L)/\lambda + \Phi/(2\pi) = m \quad (1)$$

where "λ" is a peak wavelength of a spectrum of each of the color light beams hr, hg and hb extracted from the pixels 10r, 10g and 10b, respectively, "Φ" is a phase shift which appears when light generated by each of the light emitting function layers 22r, 22g and 22b of the organic electroluminescence light emitting elements ELr, ELg and ELb is generated between and by the lower electrode 21 and the upper electrode 23, and "m" is zero or an integer.

In the display apparatus 1 having the configuration described above, the optical distance L of the organic electroluminescence light emitting elements ELr, ELg and ELb is adjusted with the film thickness of the light emitting function layers 22r, 22g and 22b between the lower electrode 21 which has the light reflecting property and the upper electrode 23 which functions as a half mirror. For example, where only the light emitting layer 22-3 from among the light emitting function layers 22 has a pattern formed thereon, the optical distance L is adjusted by the light emitting layers 22-3 (22-3r, 22-3g and 22-3b) individually for the color light beams hr, hg and hb to be taken out from the pixels.

In the display apparatus 1 having the configuration described above, the organic electroluminescence Sight emitting elements ELr, ELg and ELb of different colors formed by stacking the lower electrode 21, Sight emitting function Savers 22r, 22g and 22b and upper electrode 23 are disposed on the pixels 10r, 10g and 10b, respectively.

Referring to FIG. 1, the protective layer 25 principally protects the organic electroluminescence Sight emitting elements ELr, ELg and ELb and is formed from a passivation film made of a light passing dielectric material such as, for example, silicon nitride (SiN).

The adhesion layer 26 is used to adhere the enclosure substrate 27 to the protective layer 25 and formed from an adhesive material such as, for example, a heat setting resin material.

The enclosure substrate 27 emits color light beams hr, hg and hb for image display emitted from the pixels 10r, 10g and 10b as display light to the outside of the display apparatus 1 and is made of a light transmitting insulating material such as, for example, glass.

It is to be noted that, in order to improve the color purity and the reflection characteristic of the color light beams hr, hg and hb from which display light is formed, the enclosure substrate 27 may include color filters 29r, 29g and 29b. In this instance, the color filter 29r which passes red light therethrough is disposed on each of the red pixels 10r; the color filter 29g which passes green light therethrough is disposed on each of the green pixels 10g; and the color filter 29b which passes blue right therethrough is disposed on each of the blue pixels 10b. Further, a black matrix 31 is disposed between the color filters 29r, 29g and 29b.

Now, a configuration of the rib 17 which is a characteristic feature of the present embodiment is described.

The rib 17 is provided to isolate the organic electroluminescence light emitting elements ELr, ELg and ELb from each other and is made of an organic insulating material such as, for example, polyimide or polybensoxazole or an inorganic insulating material such as, for example, silicon dioxide (SiO2).

The rib 17 is provided on the flattening insulating layer 15 in such a manner as to cover end edges of the lower electrodes 21, and have openings 17a through which central portions of the lower electrodes 21 are exposed. The openings 17a correspond to the pixel openings and serve as formation portions of the organic electroluminescence light emitting elements ELr, ELg and ELb of the stack structure described above. Each of the openings 17a is configured such that side walls thereof are inclined in a tapering shape such that the opening width increases in an upward direction in order to prevent disconnection of the upper electrode 23 stacked as an upper layer. Therefore, if external light is reflected in the same direction by the inclined side wall portions, more particularly, by the surface portions of the upper electrode 23 which cover the side walls, then the visual observability of the emitted light or display light of the display apparatus 1 deteriorates significantly. Particularly where the upper electrode 23 functions as a half mirror, the reflection of external light at the portions is increased.

Therefore, it is assumed here that at least one of the sides which define the shape in plan of each opening 17a of the rib 17 is formed from such a curved line as hereinafter described or extends in a non-parallel relationship between the openings. A particular example of such an opening as just described is described below.

<First Example of the Opening of the Rib>

Figure 3:
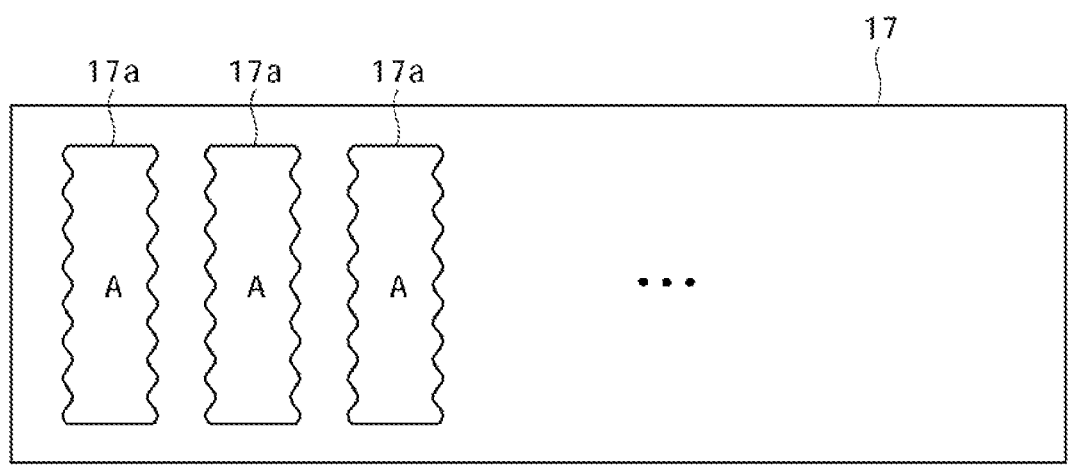
FIGS. 3, 4, 5 and 6 are schematic plan views showing different examples of a shape in plan of openings of a rib in the display apparatus.

FIG. 3 shows a first example of the shape in plan of the openings 17a where the openings 17a are viewed from the front face side, that is, from the upper electrode 23 side. Referring to FIG. 3, the shape in plan when each of the openings 17a provided on the rib 17 is viewed from the upper electrode 23 side of the display face is formed as a plane shape A whose two sides in a long side direction are each formed from a curved line which varies periodically. The curved line of the plane shape A has a periodical waveform having, for example, an amplitude of approximately 1 to 10 μm and a period of 1 to 100 μm. In this instance, the openings 17a may have the same plane shape A. It is to be noted that, also in the openings 17a having die plane shape A, the side walls extending from the sides of the curved lines are inclined in a tapering shape.

Where each opening 17a of the rib 17 has such a plane shape as seen in FIG. 3, external light incident to the side walls of the openings 17a of the opening 17a from the upper electrode 23 side is diffused and reflected by the side walls of the long-side sides corresponding to the sides of the curved fine portions. Therefore, the external light is prevented from being reflected toward the same direction, and consequently, a phenomenon that the reflected light beams interfere with each other can be moderated. By this, the visual observability of emitted light from the organic electroluminescence light emitting elements ELr, ELg and ELb provided corresponding to the openings 17a is assured. As a result, enhancement of the display characteristic of the display apparatus 1 can be anticipated.

It is to be noted that, while the curved line which forms the plane shape A of the openings 17a of the rib 17 in the first example described above has a periodic waveform, the plane shape A may otherwise have a non-periodic curved line, that is a curved line whose amplitude and period are not fixed. Further, while two sides in the long side direction of the openings 17a provided in the rib 17 are formed from a curved line, both of the long and short sides of the overall periphery of each opening 17a may be formed from a curved line. In this instance, the effect of prevention of deterioration of the visual observability caused by reflection of external light by the side walls of the openings 17a of the rib 17 is further assured.

<Second Example of the Opening of the Rib>

Figure 4:
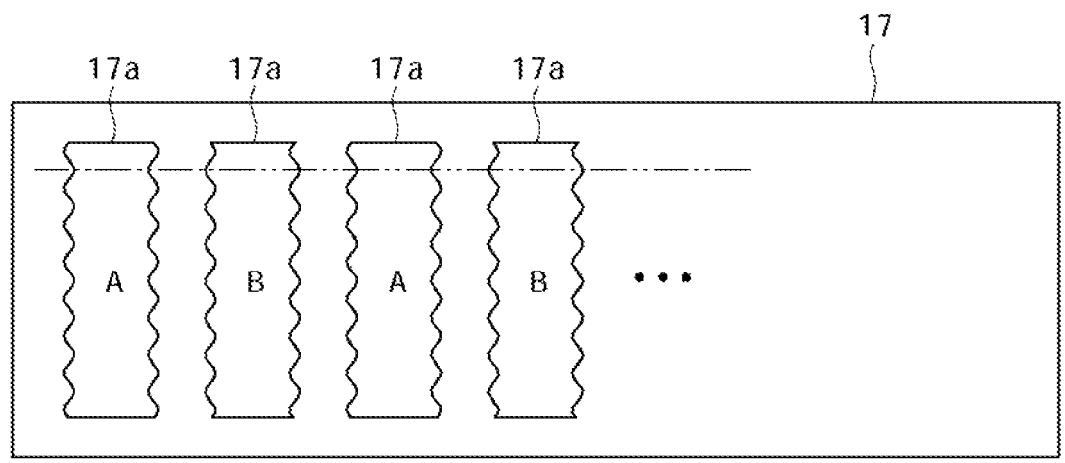

FIG. 4 shows a second example of the plane shape of an opening 17a as viewed from the front side or upper electrode 23 side. Referring to FIG. 4, each of the openings 17a provided in the rib 17 is formed so as to have a plane shape A or B whose two sides in the long side direction are each formed only from a curved line which varies periodically. The plane shape B is different in phase of the period of the curved line of the two sides in the long side direction from the plane shape A. For example, the phase of the period of the curve line of the plane shape B is reversed from that of the plane shape A at the position spaced by the same distance from any of the two minor sides. The openings 17a having such plane shapes A and B are disposed alternately.

Where the openings 17a of the rib 17 have such a shape in plan as seen in FIG. 4, in addition to the advantages achieved by the configuration described hereinabove with reference to FIG. 3, an advantage that external light beams diffused and reflected by the side walls of the adjacent openings 17a are prevented from interfering with each other can be anticipated. Similarly, interference between external light diffused and reflected by the side walls of the openings 17a having the plane shape A and external light diffused and reflected by the side walls of the openings 17a having the plane shape B can be prevented. As a result, the visual observability of emitted light from the organic electroluminescence light emitting elements ELr, ELg and ELb provided corresponding to the openings 17a can be assured with a higher degree of certainty, and enhancement of the display characteristic of the display apparatus 1 can be anticipated.

It is to be noted that, also in the second example of the openings, the curved lines which form the plane shapes A and B of the openings 17a of the rib 17 may be non-periodic curved lines or the long sides and the short sides of the overall periphery of each opening 17a may be formed from curved lines similarly as in the first example described hereinabove.

<Third Example of the Opening of the Rib>

Figure 5:
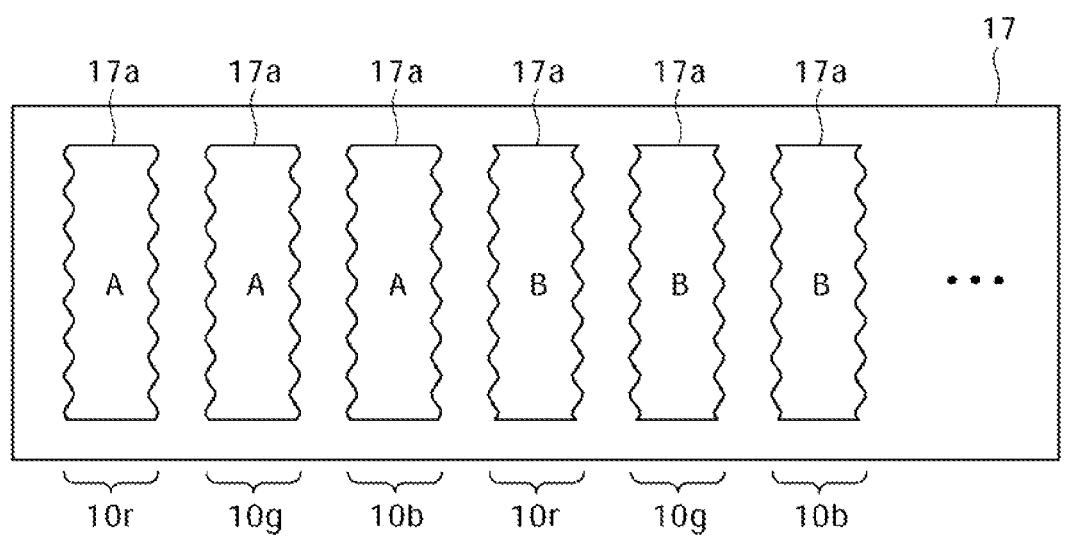

FIG. 5 shows a third example of the plane shape of the openings 17a as viewed from the front face or upper electrode 23 side. Referring to FIG. 5, each of the openings 17a provided in the rib 17 is formed so as to have a plane shape A or B whose two sides in the long side direction are each formed only from a curved line which varies periodically. The plane shapes A and B are similar to those described hereinabove with reference to FIG. 4, and the two sides on the long-side side thereof are formed from curved lines whose phases are displaced from each other. Here, the openings 17a having such plane shapes A and B as described above are disposed such that three openings 17a having the plane shape A and three openings 17a having the plane shape B are disposed alternately in accordance with the arrangement of the pixels 10r, 10g and 10b which emits light beams of the three colors.

Where the openings 17a of the rib 17 have such shapes in plan as described above with reference to FIG. 5, in addition to the advantages achieved by the configuration described hereinabove with reference to FIG. 3, interference of external light beams of different colors incoming as particular wavelengths as a result of passage of the external light beams through the color filters 29r, 29g and 29b of the same colors when the external light beams are diffused and reflected by the side walls of the openings 17a can be prevented.

In particular, external light of red passes through the color filters 29r and comes to and is reflected by the red pixels 10r and external light of green passes through the color filters 29g and comes to and is reflected by the green pixels 10g while external light of blue passes through the color filter 29b and comes to and is reflected by the blue pixel 10b. In this instance, the external light beams reflected by the side walls of the openings 17a and having same wavelengths and hence same colors interfere with each other. However, according to the configuration described above with reference to FIG. 5, since the openings 17a of the rib 17 at pixels of the same color disposed nearest to each other have the plane shapes A and B whose phases are displaced from each other, the interference described above can be prevented. As a result, the visual observability of emitted light from the organic electroluminescence light emitting elements ELr, ELg and ELb provided corresponding to the openings 17a can be assured with a higher degree of certainty, and enhancement of the display characteristic of the display apparatus 1 can be anticipated.

It is to be noted that, also in the third example of the openings, the curved lines which form the plane shapes A and B of the openings 17a of the rib 17 may be non-periodic curved lines or the long sides and the short sides of the overall periphery of each opening 17a may be formed from curved lines similarly as in the first example described hereinabove.

<Fourth Example of the Opening of the Rib>

Figure 6:
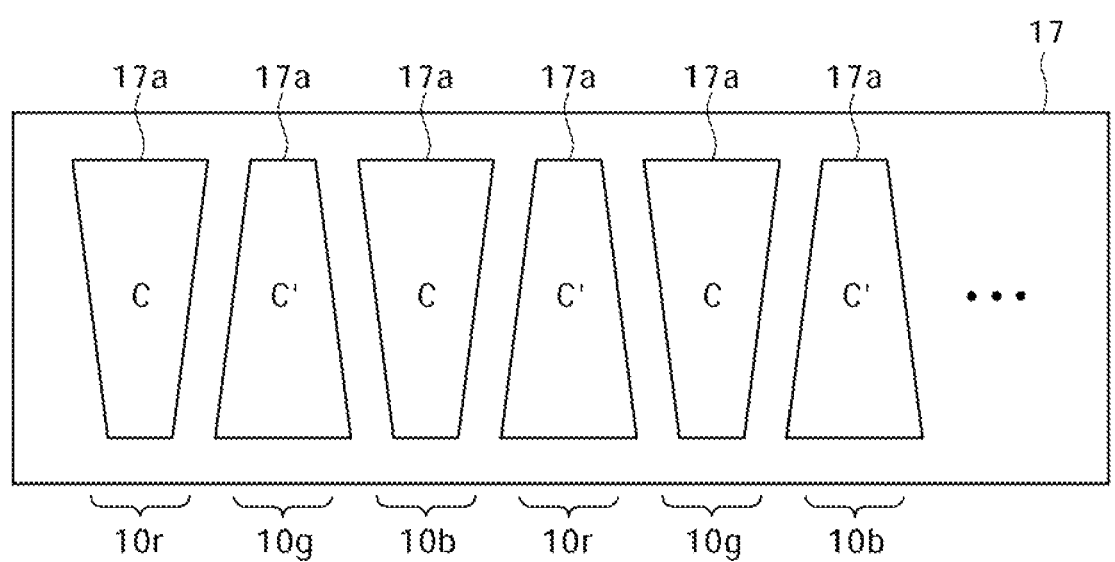

FIG. 6 shows a fourth example of the plane shape of the openings 17a as viewed from the front face or upper electrode 23 side. Referring to FIG. 6, the openings 17a provided in the rib 17 are formed such that one side of a shape in plan of one of each two adjacent ones thereof extends non-parallelly to that of the other opening 17a.

In particular, the openings 17a provided in the rib 17 are formed so as to have trapezoidal plane shapes C and C' whose two sides in the long side direction do not extend in parallel to each other. The plane shapes C and C' may be disposed alternately in the short side direction such that the upper and lower bottoms thereof are reversed therebetween. It is to be noted that the side walls also of the openings 17a of the plane shapes C and C' are inclined in a tapering shape.

Consequently, the two major sides which form upper portions of the side walls directed in the same direction from among the four sides which form the plane shapes C and C' of adjacent ones of the openings 17a extend non-parallelly to each other. For example, the left-side long sides of adjacent ones of the openings 17a extend non-parallelly to each other and also the right-side major sides extend non-parallelly to each other. Further, in this instance, at least one of sides which form the plane shape of one of the openings 17a corresponding to pixels of the same color extends non-parallelly to that of the other opening 17a in accordance with the arrangement of the pixels 10r, 10g and 10b which display light beams of the three colors. For example, where attention is paid to the red pixels 10r, among the openings 17a of adjacent ones of the red pixels 10r, the plane shapes C and C are disposed alternately. Further, between adjacent ones of the openings 17a for the red pixels 10r, two major sides which form upper portions of the side walls extending in the same direction extend non-parallelly to each other.

Where the openings 17a of the rib 17 have such shapes in plan as described with reference to FIG. 6, external light incoming to the side walls of the openings 17a of the rib 17 from the upper electrode 23 side is reflected in a direction in which the long-side side walls corresponding to the non-parallel sides are directed by the side walls. Therefore, reflection of all of the external light toward the same direction by the side wails of the openings is prevented, and the visual observability of emitted light from the organic electroluminescence light emitting elements ELr, ELg and ELb provided corresponding to the openings 17a is assured. As a result, enhancement of the display characteristic of the display apparatus 1 can be anticipated.

Further, since the openings 17a of the rib 17 at pixels of the same color which are disposed nearest to each other are formed such that the two long sides thereof disposed in the same direction extend non-parallelly to each other as described above, when external light beams of individual colors incoming with particular wavelengths as a result, of passage thereof through those of the color filters 29r, 29g and 29b which have the same colors is diffused and reflected by the side wails of the openings 17a, interference of the external light beams can be prevented. As a result, the visual observability of emitted light from the organic electroluminescence light emitting elements ELr, ELg and ELb provided corresponding to the openings 17a is assured with a higher degree of certainty. Consequently, enhancement of the display characteristic of the display apparatus 1 can be anticipated.

The rib 17 having the openings 17a of the plane shapes described hereinabove in connection with the first to fourth examples is obtained by applying, for example, a lithography method. In this instance, the rib 17 itself may be configured in a resist pattern formed by the lithography technique or may be formed by etching of an insulating film wherein the resist pattern formed by the lithography method is used as a mask.

It is to be noted that, in the embodiment described above, the organic electroluminescence light emitting elements ELr, ELg and ELb which emit light beams of different colors are provided in the pixels 10r, 10g and 10b, respectively. However, the present application can be applied not only to a display apparatus having such a configuration as described above but also widely to various display apparatus which include a rib corresponding to pixel openings. For example, as regards color display apparatus which include organic electroluminescence light emitting elements, the present application can be applied also to a configuration which includes organic electroluminescence light emitting elements which include a light emitting layer common to the pixels 10r, 10g and 10b. In this instance, the optical distance L may be differentiated among different pixels or a color conversion layer may be provided for each pixel such that display light beams of different wavelengths are extracted from the pixels 10r, 10g and 10b.

<General Configuration of the Display Apparatus>

Figure 7A:
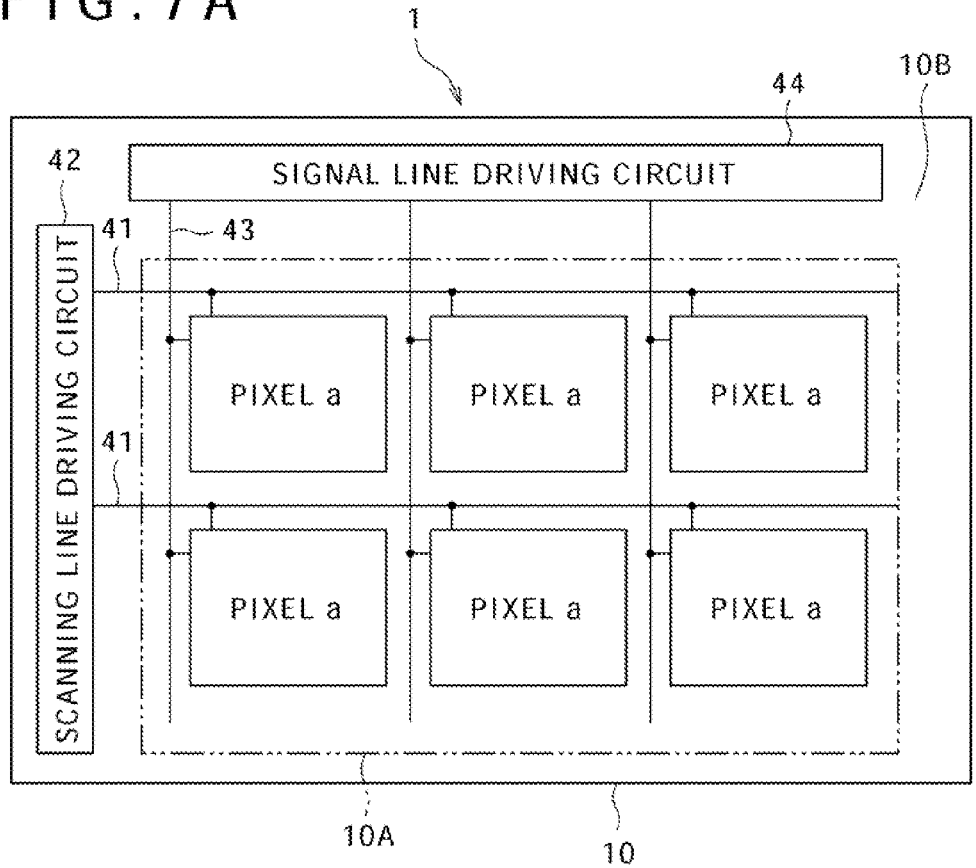
FIG. 7A is a diagrammatic view showing a circuit configuration of the display apparatus and FIG. 7B is a circuit diagram showing a pixel circuit used in the display apparatus.
Figure 7B:
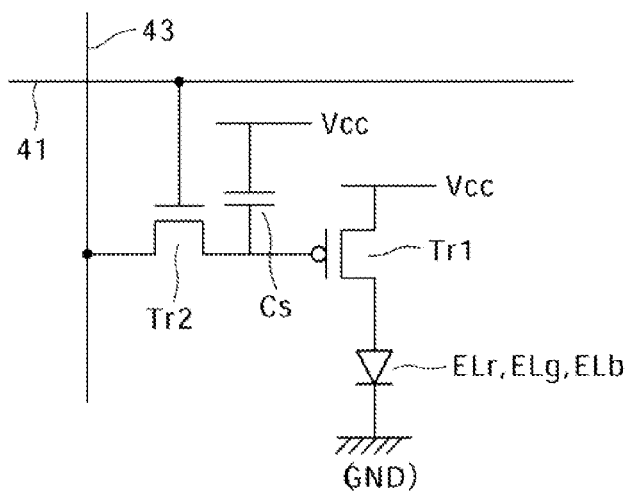

FIG. 7A shows a general configuration of the display apparatus 1 to which the present embodiment is applied, and FIG. 7B shows a configuration of a pixel circuit of the display apparatus 1 shown in FIG. 7A. In the present embodiment, the present application is applied to a display apparatus of the active matrix type.

Referring first to FIG. 7A, the display apparatus 1 includes a substrate 10 serving as a support board and having a display region 10A and a peripheral region 10B surrounding the display region 10A. The display region 10A is formed as a pixel array section wherein a plurality of scanning lines 41 and a plurality of signal lines 43 are wired perpendicularly to each other and one pixel a is provided corresponding to each of intersecting points of the scanning fines 41 and the signal lines 43. One of the organic electroluminescence light emitting elements ELr, ELg and ELb described hereinabove with reference to FIG. 1 is provided in each of the pixels a. Meanwhile, a scanning line driving circuit 42 for scanning and driving the scanning lines 41 and a signal line driving circuit 44 for supplying an image signal, that is, an input signal, according to luminance information to the signal lines 43 are disposed in the peripheral region 10B.

Referring now to FIG. 7B, the pixel circuit provided in each pixel a includes, for example, one of the organic electroluminescence light emitting elements ELr, ELg and ELb, a driving transistor Tr1, a writing transistor Tr2 and a retaining capacitor Cs. If the pixel circuit, is driven by the scanning line driving circuit 42, then an image signal written from the corresponding signal line 43 through the writing transistor Tr2 is retained by the retaining capacitor Cs, and current corresponding to the retained signal amount is supplied to the red light emitting element ELr, ELg or ELb from the driving transistor Tr1. Consequently, the red light emitting element ELr, ELg or ELb emits light with luminance corresponding to the current value.

It is to be noted that such a configuration of the pixel circuit as described above is a mere example to the end, but the pixel circuit may be configured otherwise including a capacitance element or including a plurality of transistors. In this instance, a necessary driving circuit is additionally provided in the peripheral region 10B in accordance with the modification to the pixel circuit.

Figure 8:
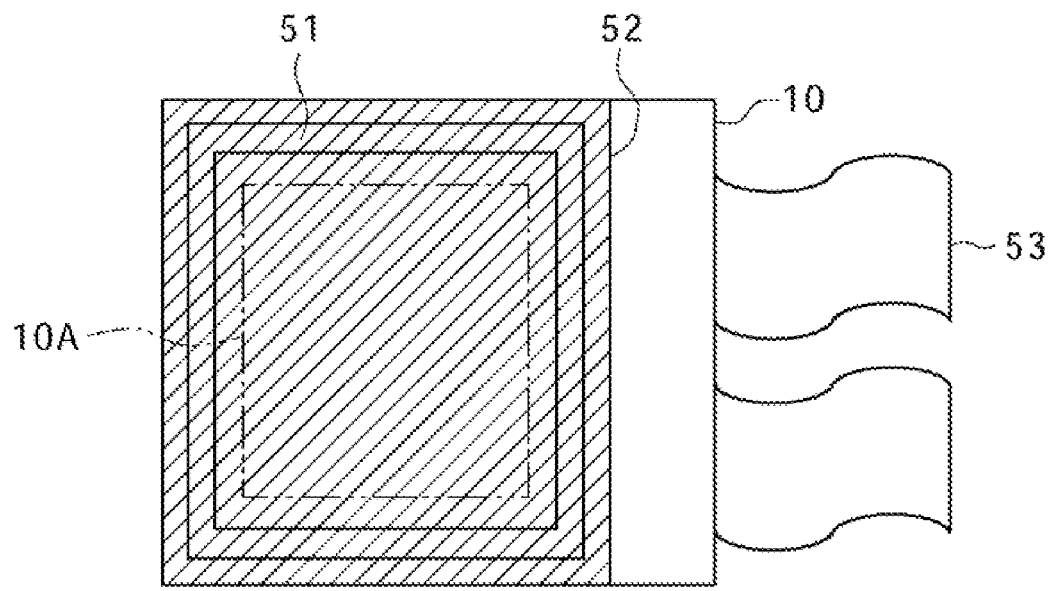
FIG. 8 is a schematic view showing a display apparatus in the form of a module of an enclosed configuration to which the present embodiment is applied.

The display apparatus described above to which the present embodiment is applied includes such a display apparatus of the module type wherein it is in an encapsulated form as seen in FIG. 8. Referring to FIG. 8, the display apparatus shown has, for example, a sealing section 51 provided so as to surround the display region 10A which is formed as a pixel array section thereby to form a display module. The sealing section 51 is used as a bonding agent to adhere the substrate 10 to an opposing member, that is, an embedding substrate 52, which is a transparent glass plate or the like. The transparent embedding substrate 52 may have a color filter, a protective film, a light blocking film and so forth provided thereon. It is to be noted that flexible printed boards 53 for inputting and outputting a signal to and from the display region 10A from and to the outside are provided on the substrate 10 as the display module on which the display region 10A is formed.

APPLICATION EXAMPLES

The display apparatus described above to which the present, embodiment is applied can be applied as a display apparatus for various electronic device shown in FIGS. 9 to 13, that is, for various electronic device in various fields which display an image signal inputted thereto or an image signal generated therein as an image such as, for example, a digital camera, a notebook type personal computer, a portable terminal apparatus such as a portable telephone set, and a video camera. In the following, several examples of an electronic device to which the present embodiment is applied are described.

Figure 9:
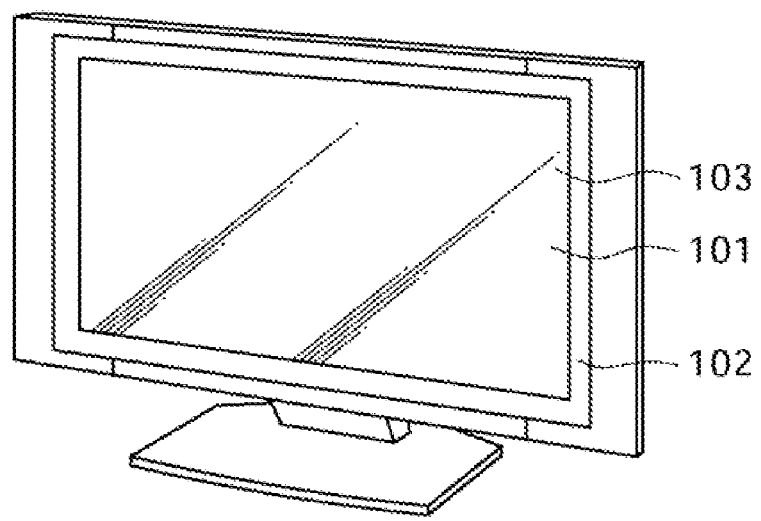
FIG. 9 is a perspective view showing a television set to which the present embodiment is applied.

FIG. 9 shows a television set to which the present embodiment is applied. Referring to FIG. 9, the television set according to the present application includes an image display screen section 101 composed of a front panel 102, a filter glass plate 103 and so forth. The image display screen section 101 is formed from a display apparatus to which the present embodiment is applied.

Figure 10A:
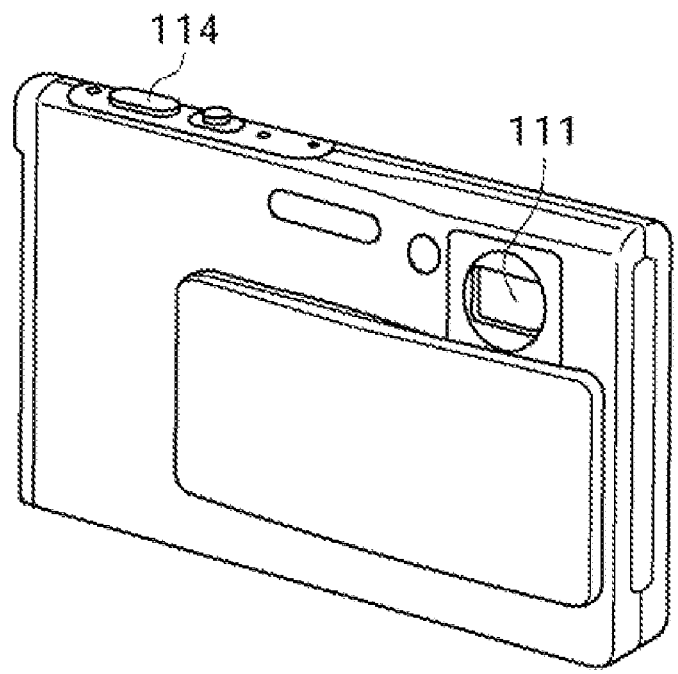
FIGS. 10A and 10B are perspective views as viewed from different directions showing a digital camera to which the present embodiment is applied.
Figure 10B:
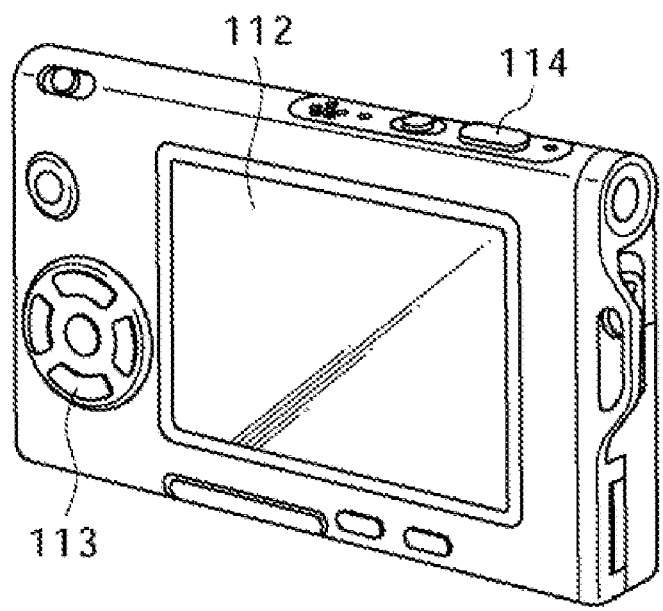

FIGS. 10A and 10B show a digital camera to which the present embodiment is applied, and particularly, FIG. 10A is a perspective view as viewed from the front side and FIG. 10B is a perspective view as viewed from the rear side. Referring to FIGS. 10A and 10B, the digital camera according to the present application includes a light emitting section 111 for emitting flashlight, a display section 112, a menu switch 113, a shutter button 114 and so forth. The display section 112 is formed from a display apparatus to which the present embodiment is applied.

Figure 11:
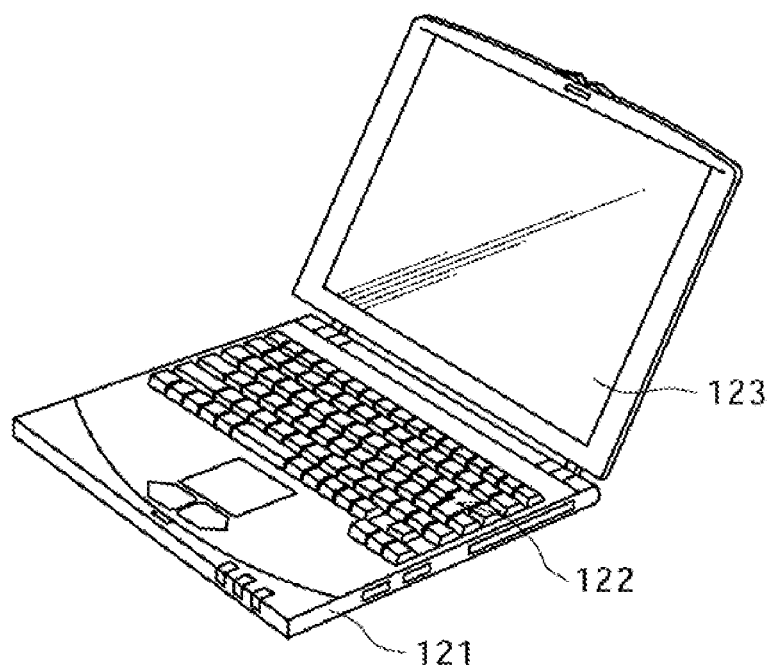
FIG. 11 is a perspective view showing a notebook type personal computer to which the present embodiment is applied.

FIG. 11 shows a notebook type personal computer to which the present embodiment is applied. Referring to FIG. 11, the notebook type personal computer according to the present application includes a keyboard 122 operated in order to input a character or the like, a display section 123 for displaying an image and so forth provided on a body 121. The display section 123 is formed from a display apparatus to which the present embodiment is applied.

Figure 12:
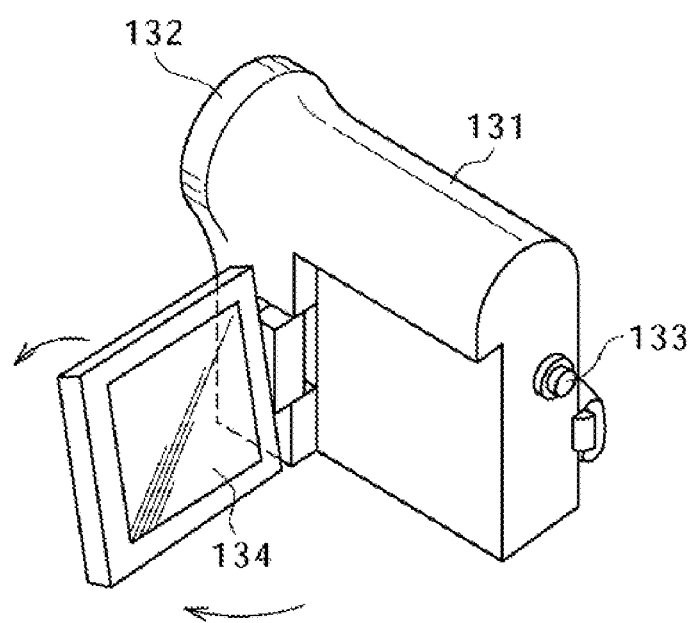
FIG. 12 is a perspective view showing a video camera to which the present embodiment is applied.

FIG. 12 shows a video camera to which the present embodiment is applied. Referring to FIG. 12, the video camera according to the present application includes a body section 331, and a lens 132 for picking up an image of an imaging object, a start/stop switch 133 for starting and stopping image pickup, a display section 134 and so forth provided on a side face of the body section 131 which is directed forwardly. The display section 134 is formed from a display apparatus to which the present embodiment is applied.

FIGS. 13A to 13G show a portable terminal apparatus such as, for example, a portable telephone set to which the present embodiment is applied. Referring to FIGS. 13A to 13G, the portable telephone set to which the present embodiment is applied includes an upper side housing 141, a lower side housing 142, a connection section 143 in the form of a hinge member, a display section 144, a sub display section 145, a picture light 146, a camera 147 and so forth. The display section 144 or the sub display section 145 is formed from a display apparatus to which the present embodiment is applied.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display apparatus, comprising:
a substrate; and
a plurality of light emitting elements arrayed on said substrate and each formed from a lower electrode, a light emitting function layer and an upper electrode stacked in this order on said substrate; wherein
a rib for element isolation is provided on said substrate and has a plurality of openings individually corresponding to said light emitting elements, and
each of said openings of said rib is formed such that at least one of sides which define a shape of the opening in plan is formed only from a curved line having a waveform or from a straight line which extends in a non-parallel relationship to a side of another one of said openings,
wherein each of the openings of the rib are formed so as to have a trapezoidal shape in plan wherein at least one of sides of the opening extends in a non-parallel relationship to an opposite side of the opening, and wherein the trapezoidal shapes are alternately disposed in a direction of the rib such that, for adjacent openings, narrow portions defining tops of the trapezoidal shapes and wide portions defining bottoms of the trapezoidal shapes are reversed.

2. The display apparatus according to claim 1, wherein at least one of sides which define a shape in plan of one of adjacent ones of said openings is formed from a periodical curved line having a different period or phase from that of a periodical curved line forming a side of the other one of the adjacent openings.

3. The display apparatus according to claim 1, wherein
pixels of different colors from which light beams of different wavelengths from each other are radiated from the upper electrode side are individually set corresponding to the openings, and
at least one of sides which define a shape in plan of one of different ones of said openings corresponding to pixels of the same color from among the pixels of the different colors is formed from a periodical curved line having a different period or phase from that of a periodical curved line forming a side of another one of the openings corresponding to pixels of the same color.

4. The display apparatus according to claim 3, wherein a color filter is provided above said upper electrode.

5. The display apparatus according to claim 1, wherein
pixels of different colors from which light beams of different wavelengths from each other are radiated from the upper electrode side are individually set corresponding to the openings, and
at least one of sides which define a shape in plan of one of different ones of said openings corresponding to pixels of the same color from among the pixels of the different colors is formed from a straight line which extends in a non-parallel relationship to a side of another one of the openings corresponding to pixels of the same color.

6. The display apparatus according to claim 5, wherein a color filter is provided above said upper electrode.

7. The display apparatus according to claim 1, wherein each of said openings of said rib is formed so as to have a side wall having such a tapering shape that the opening width increases toward a face of said display apparatus from which the light generated by said light emitting elements is extracted.

8. An electronic device, comprising:
a substrate;
a plurality of light emitting elements arrayed on said substrate and each formed from a lower electrode, a light emitting function layer and an upper electrode stacked in this order on said substrate; and
a display section; wherein
a rib for element isolation is provided on said substrate and has a plurality of openings individually corresponding to said light emitting elements, and
each of said openings of said rib is formed such that at least one of sides which define a shape in plan is formed only from a curved line having a waveform or from a straight line which extends in a non-parallel relationship to a side of another one of said openings,
wherein each of the openings of the rib are formed so as to have a trapezoidal shape in plan wherein at least one of sides of the opening extends in a non-parallel relationship to an opposite side of the opening, and wherein the trapezoidal shapes are alternately disposed in a direction of the rib such that, for adjacent openings, narrow portions defining tops of the trapezoidal shapes and wide portions defining bottoms of the trapezoidal shapes are reversed.

9. A display apparatus, comprising:
a substrate; and
a plurality of light emitting elements arrayed on said substrate and each formed from a lower electrode, a light emitting function layer and an upper electrode stacked in this order on said substrate; wherein
a rib for element isolation is provided on said substrate and has a plurality of openings individually corresponding to said light emitting elements, and each of said openings of said rib is formed such that:
  (i) at least one of sides which define a shape of the opening in plan is formed only from a curved line or from a straight line which extends in a non-parallel relationship to a side of another one of said openings; and
  (ii) at least one of sides which define a shape of the opening in plan is formed from a straight line,
wherein each of the openings of the rib are formed so as to have a trapezoidal shape in plan wherein at least one of sides of the opening extends in a non-parallel relationship to an opposite side of the opening, and wherein the trapezoidal shapes are alternately disposed in a direction of the rib such that, for adjacent openings, narrow portions defining tops of the trapezoidal shapes and wide portions defining bottoms of the trapezoidal shapes are reversed.

* * * * *